INVENTOR
WILLIAM B. PENNEBAKER

BY

ATTORNEYS

United States Patent Office 3,419,761 Patented Dec. 31, 1968

3,419,761

METHOD FOR DEPOSITING SILICON NITRIDE INSULATING FILMS AND ELECTRIC DEVICES INCORPORATING SUCH FILMS

William B. Pennebaker, Putnam Valley, N.Y., assignor to International Business Machines Corporation, Armonk, N.Y., a corporation of New York Filed Oct. 11, 1965, Ser. No. 494,789
16 Claims. (Cl. 317—234)

ABSTRACT OF THE DISCLOSURE

Solid state devices are formed in selected surface portions of a semiconductive substrate and include at least one pn junction extending to the substrate surface. A thin insulating layer of silicon nitride is located over the substrate surface and includes a pattern of openings providing electrical access to the solid state devices. Current carrying metallic layers are located over the silicon nitride layer and connected to such devices through such openings. Both the silicon nitride layer and the current carrying metallic layers extend in planes substantially parallel to the surface of the semiconductive substrate whereby a laminate-type structure is defined. In the preferred embodiment, an insulated-gate field effect transistor is shown wherein the gate insulating layer comprises silicon nitride.

The present invention relates to a method for depositing insulating films and to solid state electrical devices incorporating such films. More particularly, the invention is concerned with the deposition of films of silicon nitride ($Si_3N_4$) having excellent insulating properties and the use of such films in solid state electrical devices.

In the production of solid state electrical devices, it is well known that insulating layers may be deposited as integral layers of the devices by sputtering techniques. The insulating materials employed have generally been silicon oxide and dioxide and various metal oxides, such as alumina. During the depoistion of such films by sputtering, it has been found that negative oxygen ions are formed which are accelerated to the substrate. These ions may cause damage when they impinge on the substrate. This results in imperfect insulating films which may affect the reliability and electrical characteristics of the resulting device.

Moreover, it has been found that most oxygen containing insulating films are not resistant to certain chemical etchants. Thus, during selective etching to provide access for contact formation, problems have been encountered in achieving close control of the etching procedure.

Therefore, the primary object of the present invention is to provide a method for producing excellent insulating thin films which are continuous and relatively free from surface imperfections and which are generally nonreactive in the presence of conventional chemical etchants. A further object of the invention is to provide high quality silicon nitride ($Si_3N_4$) insulating films which are relatively free from surface defects and to provide solid state electrical devices incorporating such films.

The manner in which the foregoing objectives and many other highly desirable advantages are achieved in accordance with the present invention will be more fully apparent in the light of the following detailed description. The description is of a preferred embodiment and illustrates the best mode that has been contemplated for carrying out the invention.

Suitable apparatus for carrying out the process of the invention and producing the desired products is illustrated in the accompanying drawing. An illustration of the application of the insulating films of the present invention in the production of solid state electric devices is also set forth in the drawing.

According to the invention, it has now been found that excellent insulating films for use in solid state electrical devices, such as integrated circuits, may be formed by the deposition of thin films of silicon nitride by reactive radio frequency sputtering. The resulting films provide good insulating layers in the fabrication of solid state electrical devices since they exhibit a high breakdown voltage and low leakage current. In particular, the films are relatively free from surface defects, as compared with the conventional oxygen-containing insulating layers, and are also more resistant to attack by chemical etchants.

The insulating films of the present invention may be deposited on any suitable substrate, but are of particular value as insulating layers on semiconductor substrates. The manner in which the silicon nitride films are deposited onto such substrates will be better understood by reference to the accompanying drawing.

Figure 1:
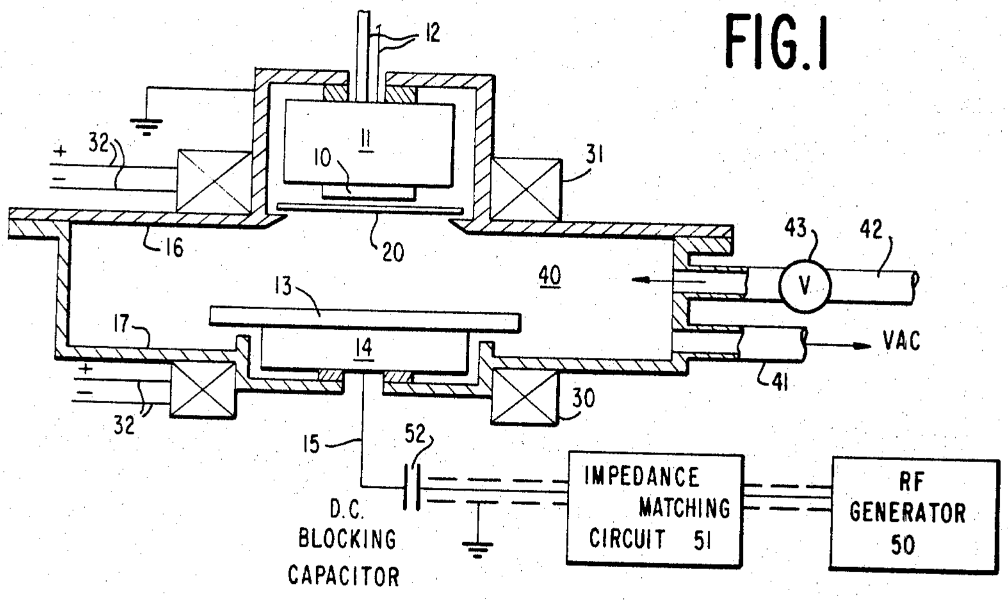
FIGURE 1 is a generally schematic, side-sectional view of a sputtering system for use in practicing the invention.

As shown in FIGURE 1, substrate 10 is attached in any suitable manner, as by clamping, to substrate holder 11. Leads 12 connect holder 11 to electrical and thermal controls for maintaining the temperature of the substrate holder and substrate at desired levels.

A source of silicon material 13 is employed as the cathode and rests on a metal field plate 14 which is connected by electrical lead 15 to a source of radio frequency power. Source 13 and substrate 10 can be separated, for example, by a distance of approximately 1 inch.

Shields 16 and 17 surrounding the substrate and cathode, respectively, are connected to ground so as to function as anodes.

A removable shutter 20 is positioned between silicon plate 13 and substrate 10 during the initial stage of the sputtering procedure. Means, not shown, are provided for removing this shutter during the deposition.

It has been found to be preferable to produce a magnetic field substantially perpendicular to the respective planes of the cathode and substrate so as to confine the plasma formed during sputtering process whereby higher rates of deposition are achieved. This magnetic field may be provided in any suitable manner, such as by placing coils 30 and 31 surrounding the cathode and substrate. Suitable leads 32 connecting the coils to a source of electric current, not shown, permit the desired magnetic field to be generated within the deposition chamber 40.

Conduit 41 is connected to a vacuum pump, not shown, through which the deposition chamber may be evacuated. Conduit 42 is connected to a source of gas which is admitted through valve 43 into the deposition chamber 40. The gas is preferably pure nitrogen or a gas containing nitrogen or a nitrogen compound which yields sufficient nitrogen during glow discharge to react with the sputtered silicon from plate 13 to form silicon nitride on the surface of substrate 10. Mixtures of nitrogen with an inert gas, such as argon, may be employed.

Cathode 14 is connected through coaxial lead 15 to any suitable source of RF power. In one embodiment, this power supply comprises an RF generator 50, impedance matching circuit 51, and DC blocking capacitor 52.

In a typical deposition, chamber 40 is evacuated to remove contaminants and nitrogen or other nitrogen-supplying gas is bled in through valve 43 and conduit 42. For example, when pure nitrogen is employed, system pressures can be determined between 0.5 microns and 20 microns. The RF generator 50 is actuated, and, illustratively, may provide a power in the range of about 400 watts and a current having a frequency of about 13.6 megacycles. System pressures are maintained so as to at least sustain the discharge.

It is preferable to sputter-clean the silicon plate 13 for about a half-hour prior to actual deposition. During sputter-cleaning, shutter 20 is maintained in place to protect the surface of substrate 10.

Having completed the sputter cleaning, the shutter 20 is removed and a thin film of silicon nitride is deposited on the surface of substrate 10. During deposition, the substrate is preferably maintained at a temperature of 300° C. or more.

During the deposition, coils 30 and 31 are provided with a current of about 3 amperes which generates a magnetic field having a strength of about 20 oersteds per ampere perpendicular to the plane of the substrate to confine the plasma.

Under these conditions, the plasma, thus produced, bombards the surface of the silicon source so as to dislodge particles of silicon. It is not clear whether the silicon immediately reacts with the nitrogen or does so on the surface of the substrate. In either case, a continuous, uniform film of silicon nitride is deposited. Deposition rates of about one-half micron per hour are achieved under the conditions of the preceding example.

Insulating films formed according to the described procedure have been found to have breakdown voltages of up to about 95 volts for a film thickness of 13,000 A. The dielectric constant of such films is on the order of 7.3.

The resulting insulating layers exhibit remarkable resistance to common etchants used in the manufacture of integrated circuits. The results of contacting silicon nitride films produced according to the present invention with various etchants are reported in the following table:

TABLE

| Etchant composition: | Results |
|---|---|
| Concentrated hydrofluoric acid | No attack. |
| Concentrated hydrogen peroxide solution | Do. |
| Concentrated hydrogen peroxide and sodium hydroxide solution | Do. |
| Concentrated hydrofluoric acid and concentrated nitric acid | No attack. Although the film remains intact there is a slight change in color. |

Figure 2A:
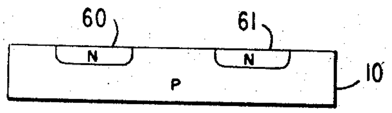
FIGURES 2 is a side-sectional, edge view of an insulated-gate field effect transistor device incorporating an insulating film produced in accordance with the invention.
Figure 2B:
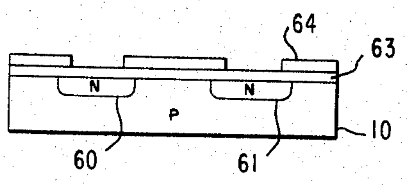
Figure 2C:
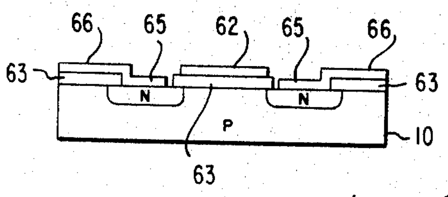

One manner in which a thin insulating layer of silicon nitride can be employed in solid state electrical devices, for example, in an insulated-gate field effect transistor, is shown in FIGURES 2A, 2B, and 2C. As illustrated, a thin layer of silicon nitride is employed as an insulating film between a semiconductor wafer and a metallic pattern so as to define a metal-insulator-semiconductor structure. As shown, substrate, or wafer, 10 formed of semiconductor material, e.g., P-type silicon, is initially subjected to a diffusion process whereby spaced regions of opposite-conductivity type are formed to define source and drain electrodes 60 and 61. Conventionally, a thin pattern of silicon dioxide ($SiO_2$), not shown, is formed over the surface of wafer 10 as a mask for diffusing source and drain electrodes 60 and 61. For example, such silicon dioxide diffusion mask can be formed by exposing substrate 10 at approximately 1250° C. to an atmosphere of either oxygen ($O_2$), oxygen and water vapor ($O_2+H_2O$), or carbon dioxide ($CO_2$) for a time sufficient to be formed in a thickness of approximately 5000 A. When formed, conventional photo lithographic techniques are employed to define "diffusion windows" for exposing surface portions of substrate 10 wherein source and drain diffusions 60 and 61 are to be effected. Substrate 10 is then heated at a temperature ranging between 1100° C. and 1250° C. in a reactive atmosphere, e.g., phosphorus pentoxide ($P_2O_5$), to form the N-type source and drain diffusions 60 and 61. Such fabrication steps are more particularly described in the G. Cheroff et al. patent application entitled "Method for Fabricating Insulated-Gate Field Effect Transistors Having Controlled Operating Characteristics," Ser. No. 468,481, which was filed on June 30, 1965 and assigned to a common assignee.

To complete the structure of the insulate-gate field effect transistor, a gate electrode 62 (c.f., FIG. 2C) is insulated from and registered in electrical-field applying relationship with the narrow surface portion of substrate 10 intermediate source and drain diffusions 60 and 61. The surface portion of substrate 10 intermediate source and drain diffusions 60 and 61 defines a channel along which conduction is field-modulated by appropriate biasing of gate electrode 62. Prior to gate metallization, the substrate 10 is immersed in a suitable etchant, e.g., buffered hydrofluoric acid (HF), to remove the silicon dioxide diffusion mask and expose the surface of substrate 10.

The substrate is then mounted in a system of the type described in FIGURE 1 and a thin insulating layer 63 of silicon nitride is deposited over the entire surface of substrate 10. A layer of photoresist material 64 is formed over the surface of the thin insulating layer 63 and selectively reacted. As shown in FIGURE 2B, photoresist layer 64 is reacted such that, when developed, at least portions of the substrate surface defined by source and drain diffusions 60 and 61 are exposed. The resulting structure is then subjected to an ion etching, or bombardment, whereby openings 65 are cut into thin insulating layer 63 so as to expose the surfaces of source and drain diffusions 60 and 61. For example, openings 65 can be formed by radio frequency sputtering techniques as described in "Sputtering of Dielectrics by High-Frequency Fields," by G. S. Anderson et al., Journal of Applied Physics, vol. 33, No. 10, October 1962, pages 2991 through 2992 and, also, "RF Sputtering of Insulators," by P. D. Davidse et al., as presented at the Third International Vacuum Congress, at Stuttgart, Germany, June 28 through July 2, 1965. Portions of photoresist layer 64 remaining subsequent to ion etching are removed by an appropriate solvent. The structure of the field effect transistor is then completed by a metallization step whereby gate conductor 62 and also electrical conductors 66 to source and drain diffusions 60 and 61 are made. For example, a thin layer of aluminum can be formed over the entire surface of insulating layer 63 and within openings 65 to contact source and drain diffusions 60 and 61. Appropriate photolithographic techniques are then employed to define particular metallic patterns which form gate electrode 62 and also electrical conductors 66. In such metal-insulator-semiconductor structure, thin layer 63 of silicon nitride provides very effective insulation between substrate 10 and the metallized patterns.

While the thin insulating films of the present invention have been described as being deposited onto the surface of a silicon substrate, it will be apparent that the use of such films is not so limited. For example, such films can be employed in any metal-insulator-semiconductor or any metal-insulator-metal structure.

While the invention has been particularly shown and described with reference to preferred embodiments thereof, it will be understood by those skilled in the art that various changes in form and details may be made therein without departing from the spirit and scope of the invention.

What is claimed is:

1. In combination, a semiconductor substrate having a device formed in a portion of one surface thereof, a thin insulating layer comprising a layer of silicon nitride located over said one surface and extending over and beyond said surface portion in a plane substantially parallel to said one surface, and a current carrying metallic layer supported on said thin insulating layer and extending over and beyond said surface portion in a plane substantially parallel to said one surface whereby a laminate-type structure is defined, a portion of said current carrying metallic layer passing through said thin insulating layer to electrically contact said device.

2. The combination of claim 1 wherein said substrate is formed of a body of silicon semiconductor material.

3. The combination as defined in claim 1 wherein said thin insulating layer consists of silicon nitride and is supported on said substrate.

4. In a solid state electrical device, a wafer of semiconductor material of first conductivity type, said wafer including at least one diffused portion of opposite conductivity type exposed at one surface thereof, a thin insulating layer comprising a layer of silicon nitride material located over said one surface of said wafer and said diffused portion, and a current carrying metallic layer supported on said thin insulating layer so as to be insulated from said one surface and connected to said one diffused portion through said thin insulating layer, said metallic layer and said thin insulating layer extending in planes substantially parallel to said one surface whereby a laminate-type structure is defined.

5. A solid state electrical device as defined in claim 1 wherein said semiconductor material is silicon.

6. A solid state electrical device as defined in claim 4 wherein said device includes a pn junction.

7. A solid state electrical device as defined in claim 4 wherein said thin insulating layer consists of silicon nitride and is supported on said one surface.

8. A solid state electrical device as defined in claim 4 wherein said current carrying metallic layer is formed of aluminum.

9. In a solid state electrical device, a wafer of semiconductor material of first conductivity type, said wafer including spaced portions of opposite-conductivity type exposed at one surface thereof and defining source and drain electrodes, that portion of said one surface intermediate said spaced portions defining a conduction channel therebetween, a thin insulating layer located over said intermediate portion and extending over said one surface, at least said thin insulating layer located over said intermediate portion comprising a thin layer of silicon nitride, current carrying conductive layers supported on said thin insulating layer and connected to said spaced portions, respectively, said conductive layers and said thin insulating layer extending in planes substantially parallel to the surface of said wafer whereby a laminate-type structure is defined, and a gate electrode located over said thin insulating layer and overlying at least a portion of said intermediate portion.

10. A solid state electrical device as defined in claim 9 wherein said semiconductor material is silicon.

11. A solid state device as defined in claim 9 wherein said thin insulating layer located over said intermediate portion consists of silicon nitride.

12. A solid state electrical device as defined in claim 9 wherein said wafer includes diffused-spaced portions of opposite-conductivity type defining said source and drain electrodes.

13. In combination a body of semiconductive material of first conductivity type and having at least one portion of opposite conductivity type defining a pn junction therewith, said pn junction emerging at one surface of said body, a thin insulating layer comprising a layer of silicon nitride located over said one surface of said body and extending over said pn junction in a plane substantially parallel to said one surface, and a current carrying conductive layer supported on said silicon nitride layer and extending over said pn junction at its emergence and in a plane substantially parallel to said thin layer and said one surface of said body so as to be electrically insulated from said one surface whereby a laminate-type structure is defined, said conductive layer being electrically connected to said one portion of opposite conductivity type.

14. The combination as defined in claim 13 wherein said semiconductive material is silicon.

15. The combination as defined in claim 13 wherein said conductive layer is formed of aluminum.

16. The combination as defined in claim 13 wherein said thin insulating layer consists of silicon nitride and is supported on said thin insulating layer.

References Cited

UNITED STATES PATENTS

| | | | |
|---|---|---|---|
| 3,102,230 | 8/1963 | Kahng | 323—94 |
| 3,165,430 | 1/1965 | Hugle | 148—187 |
| 3,246,214 | 4/1966 | Hugle | 317—235 |
| 3,287,243 | 11/1966 | Ligenza | 204—192 |
| 3,312,879 | 4/1967 | Godejahn | 317—234 |

JOHN W. HUCKERT, *Primary Examiner.*

R. SANDLER, *Assistant Examiner.*

U.S. Cl. X.R.

29—571, 578, 590; 317—235

PO-1050
(5/69)

UNITED STATES PATENT OFFICE

CERTIFICATE OF CORRECTION

Patent No. 3,419,761 Dated December 31, 1968

Inventor(s) William B. Pennebaker

It is certified that error appears in the above-identified patent and that said Letters Patent are hereby corrected as shown below:

In column 5, line 28, numeral "1" should be --4--. That is, claim 5 should be dependent from claim 4, not from claim 1.

SIGNED AND SEALED
NOV 10 1970

(SEAL)
Attest:

Edward M. Fletcher, Jr.
Attesting Officer

WILLIAM E. SCHUYLER, JR.
Commissioner of Patents